United States Patent
Kakimura

[11] Patent Number: 6,157,267
[45] Date of Patent: Dec. 5, 2000

[54] VARIABLE FREQUENCY MULTIPLE LOOP RING OSCILLATOR

[75] Inventor: Yasushi Kakimura, Kawasaki, Japan

[73] Assignee: Fujitsu Limited, Kawasaki, Japan

[21] Appl. No.: 09/128,657

[22] Filed: Aug. 4, 1998

[30] Foreign Application Priority Data

Jan. 20, 1998 [JP] Japan .................. 10-008985

[51] Int. Cl.⁷ .................................................. H03B 5/24
[52] U.S. Cl. .............................. 331/57; 331/1 A; 331/34; 331/177 R; 331/179
[58] Field of Search ........................ 331/1 R, 1 A, 331/16, 34, 57, 177 R, 179

[56] References Cited

U.S. PATENT DOCUMENTS

| | | | |
|---|---|---|---|
| 5,182,528 | 1/1993 | Zuta | 331/1 A |
| 5,331,294 | 7/1994 | Watanabe et al. | 331/57 |
| 5,349,311 | 9/1994 | Mentzer | 331/57 |
| 5,465,076 | 11/1995 | Yamauchi et al. | 331/179 |
| 5,525,939 | 6/1996 | Yamauchi et al. | 331/57 |
| 5,777,520 | 7/1998 | Kawakami | 331/1 R |
| 5,861,780 | 1/1999 | Fukuda | 331/57 |

FOREIGN PATENT DOCUMENTS

| | | |
|---|---|---|
| 6-188693 | 7/1994 | Japan . |
| 7-326964 | 12/1995 | Japan . |

*Primary Examiner*—David Mis
*Attorney, Agent, or Firm*—Armstrong, Westerman, Hattori, McLeland & Naughton

[57] ABSTRACT

A variable frequency oscillator including an oscillation unit including a ring oscillator having multiple loops, and a frequency control unit controlling switching among the multiple loops in accordance with a control input indicative of an oscillation frequency and thus generating an oscillation signal having the oscillation frequency.

9 Claims, 7 Drawing Sheets

VARIABLE FREQUENCY MULTIPLE LOOP RING OSCILLATOR

BACKGROUND OF THE INVENTION

1. Field of the Invention

The present invention generally relates to variable frequency oscillators, and more particularly to a variable frequency oscillator which varies the oscillation frequency based on a control voltage or control data.

Recent computer systems are required to transfer signals at a high speed and improve accuracy and reliability, and are further required to reduce the cost of hardware. In order to meet the above requirements, it is required to efficiently develop and design the systems and circuit configurations.

2. Description of the Related Art

Figure 1:
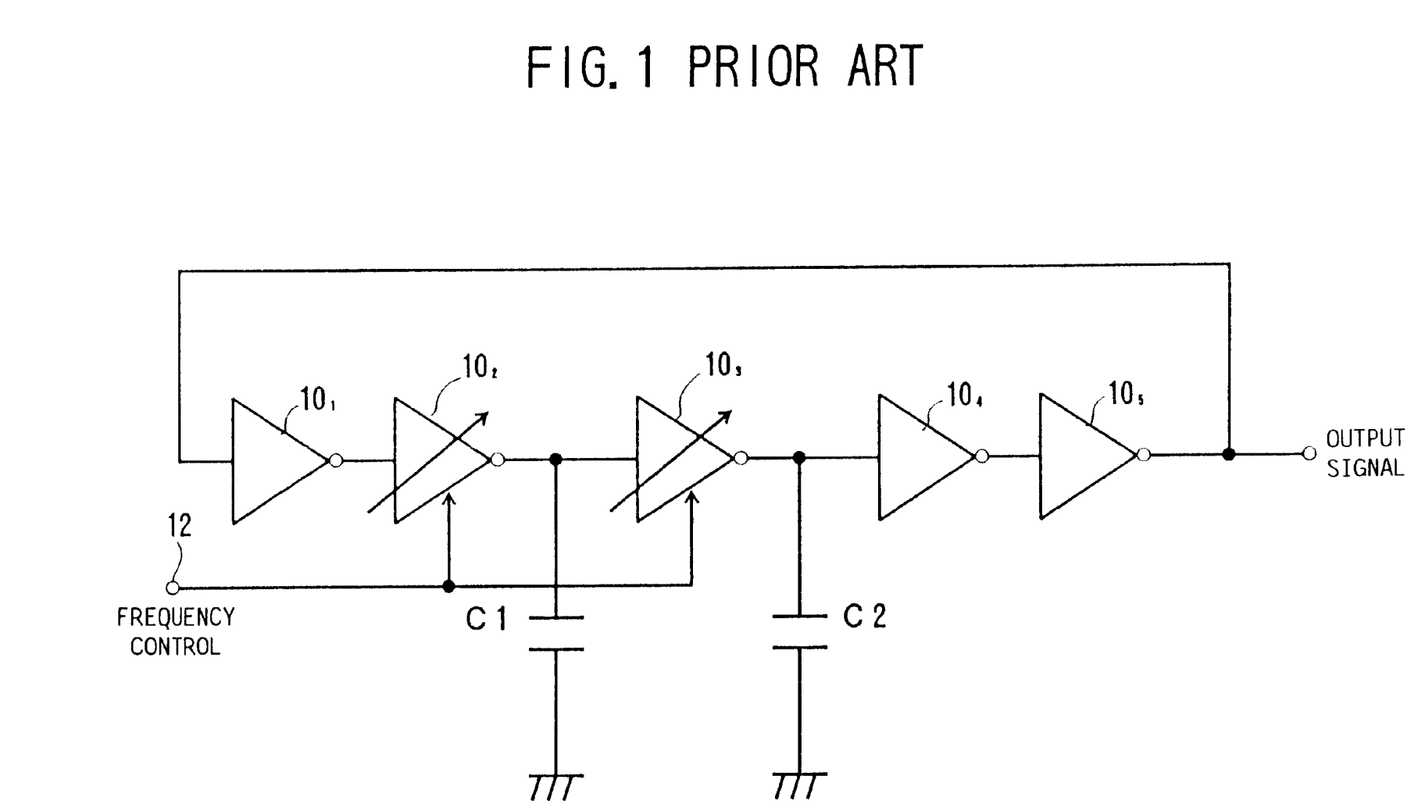
FIG. 1 is a block diagram of a conventional voltage-controlled oscillator.

FIG. 1 is a block diagram of a conventional voltage-controlled oscillator (VCO), which is an analog circuit. Inverters $10_1$–$10_5$ form a ring oscillator. Capacitors C1 and C2 for delaying signals are connected to the output terminals of the inverters $10_2$ and $10_3$, which are supplied with a frequency control voltage via a terminal 12. The frequency of an output signal at a terminal 14 can be varied by changing the signal delay times of the inverters $10_2$ and $10_3$.

However, the conventional voltage-controlled oscillator has a disadvantage in that the frequency of the oscillation signal depends on the number of stages of inverters and a wiring delay. Hence, the lower oscillation frequency is obtained by increasing the number of stages of inverters and the length of the signal line. This increases the circuit size. Further, although the voltage-controlled oscillators have an identical circuit configuration, they have different oscillation frequencies due to certain factors of the production process.

There is another disadvantage due to the arrangement in which the capacitance values of the inverters $10_2$ and $10_3$ are respectively changed in response to the frequency control voltage and thus the signal delay time can be changed. Thus, a large delay time causes an increased rounding of signal waves. In this case, if noise is superimposed to the signal at the time of the rising and/or falling edge of the signal waveform, the inverter which receives the above signal is liable to malfunction. The frequency of the output oscillation signal is liable to disperse over a certain range (jitter). A complicated circuit design and an increased circuit size will be required to reduce or cut noise form peripheral circuits.

SUMMARY OF THE INVENTION

It is a general object of the present invention to provide a variable frequency oscillator in which the above disadvantages are eliminated.

A more specific object of the present invention is to provide a compact size variable frequency oscillator which is hardly affected by noise and has reduced jitter.

The above objects of the present invention are achieved by a variable frequency oscillator comprising: an oscillation unit including a ring oscillator having multiple loops; and a frequency control unit controlling switching among the multiple loops in accordance with a control input indicative of an oscillation frequency and thus generating an oscillation signal having the desired oscillation frequency.

The above variable frequency oscillator may be configured so that the oscillation unit comprises: a first loop; a second loop having a part of the first loop; and a switch circuit controlling switching between the first and second loops.

The variable frequency oscillator may be configured so that the frequency control unit comprises: a counter counting the number of times that a signal circulates in the second loop in accordance with the value of the control input; and a logic circuit generating a select signal indicating the switching between the first loop and the second loop on the basis of a count value of the counter, the select signal being supplied to the switch circuit.

The variable frequency oscillator may be configured so that the oscillation unit comprises: a first loop; a second loop having a part of the first loop; a third loop having a part of the second loop; a first switch circuit controlling switching between the first and second loops; and a second switch circuit controlling switching between the second and third loops.

The variable frequency oscillator may be configured so that the frequency control unit comprises: a first counter counting the number of times that a signal circulates in the second loop in accordance with the value of the control input; a second counter counting the number of times that a signal circulates in the third loop in accordance with the value of the control input; a first logic circuit generating a select signal indicating the switching between the first loop and the second loop on the basis of a count value of the first counter, the select signal being supplied to the switch circuit; and a second logic circuit generating another select signal indicating the switching between the second loop and the third loop on the basis of a count value of the second counter, the above-mentioned another select signal being supplied to the switch circuit.

The variable frequency oscillator may be configured so that: the control input is an analog voltage; and the variable frequency oscillator comprises an analog-to-digital converter converting the analog voltage into digital data, which is supplied to the frequency control unit.

The variable frequency oscillator may be configured so that: the control input is digital data; and the variable frequency oscillator comprises a register which stores the digital data, which is then supplied to the frequency control unit.

The variable frequency oscillator may be configured so that: the control input is one of an analog voltage and digital data; and wherein the variable frequency oscillator comprises: an analog-to-digital converter converting the analog voltage into a digital signal; a register which stores the digital data; and a selector selectively outputting one of the digital signal and the digital data to the frequency control unit.

The above objects of the present invention are also achieved by a variable frequency oscillator comprising: a ring oscillator generating a pulse; an output unit which outputs the pulse; a counter counting the number of times that the pulse is circularly propagated through the ring oscillator; and a control circuit supplying the pulse to the output unit when the counter counts a given count value.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2:
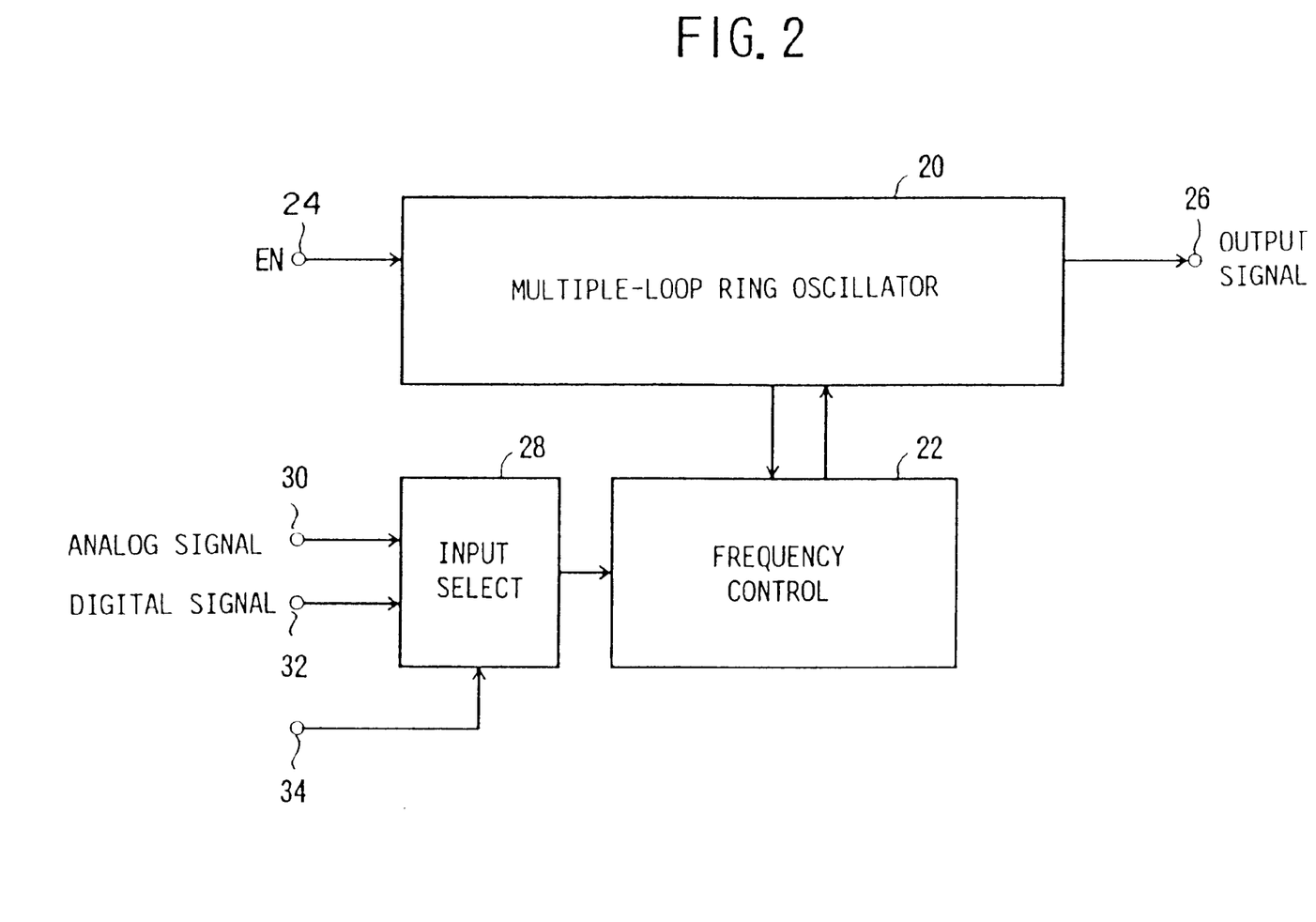
FIG. 2 is a block diagram of a variable frequency oscillator according to a first embodiment of the present invention.

FIG. 2 is a block diagram of a variable frequency oscillator according to a first embodiment of the present invention. A multiple-loop ring oscillator 20 can form multiple loops, which are selected under the control of a frequency controller 22. The ring oscillator 20 starts to oscillate when receiving an enable signal EN via a terminal 24. The output oscillation signal of the ring oscillator 20 is output via a terminal 26. An input selection unit 28 is supplied, via a terminal 30, with an analog control voltage indicating the oscillation frequency or is supplied, via a terminal 32, with digital control data indicating the oscillation frequency. The input selection unit 28 selects either the analog control voltage or the digital control data in accordance with a select signal supplied via a terminal 34, and thus generates control data, which is then applied to the frequency controller 22. The frequency controller 22 determines, for each loop, the number of times that the signal circulates in the loop, and outputs a resultant control signal to the ring oscillator 20.

Figure 3:
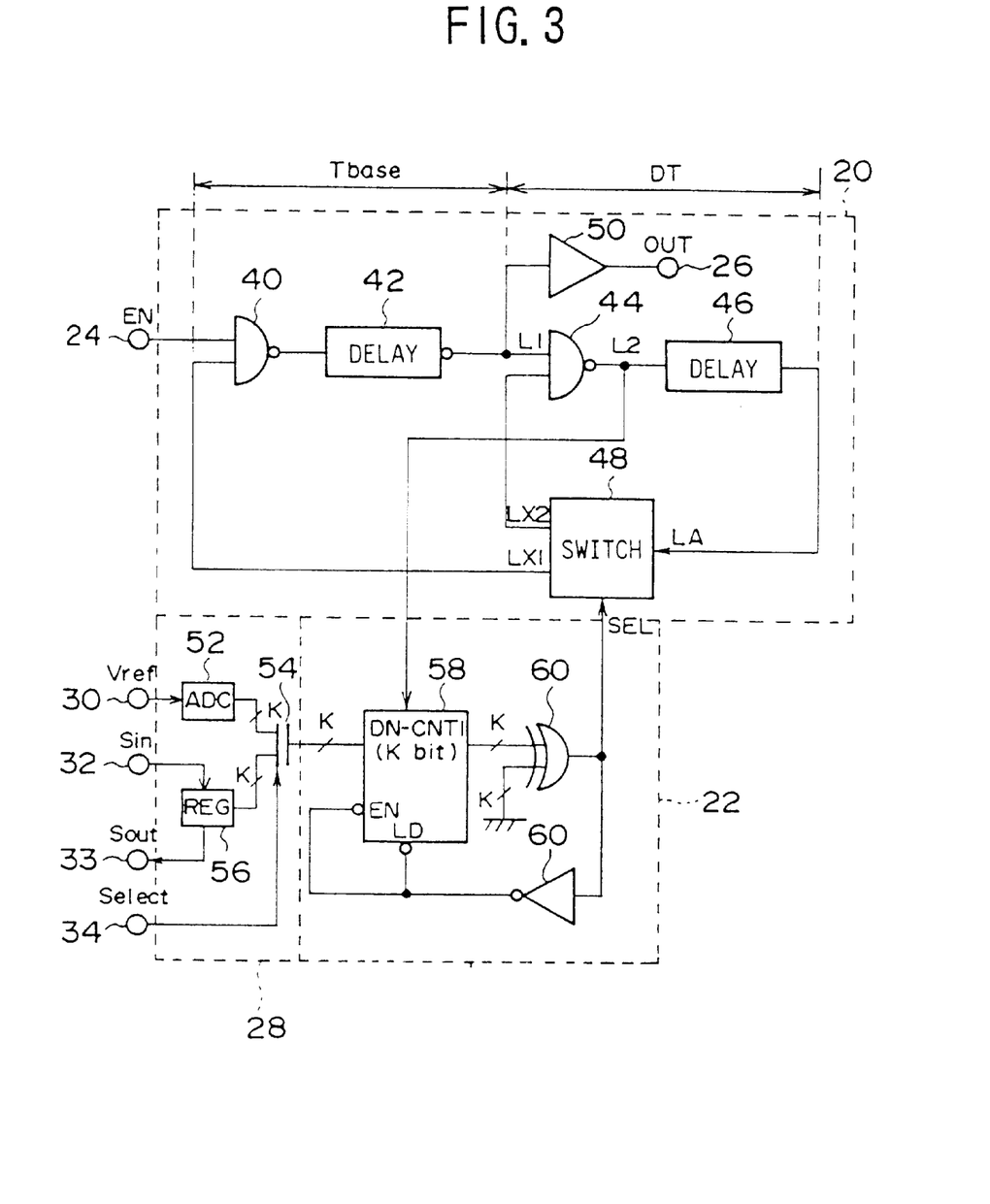
FIG. 3 is a circuit diagram of the variable frequency oscillator according to the first embodiment of the present invention.

FIG. 3 is a circuit diagram of the variable frequency oscillator according to the first embodiment of the present invention. In FIG. 3, parts that are the same as those shown in FIG. 2 are given the same reference numbers. The multiple-loop ring oscillator 20 includes NAND circuits 40 and 44, delay circuits 42 and 46, a switch circuit (control circuit) 48 and an output buffer 50. A first loop is formed by the NAND circuit 40, the delay circuit 42, the NAND circuit 44, the delay circuit 46 and the switch circuit 48. A second loop is formed by the NAND circuit 44, the delay circuit 46 and the switch circuit 48. That is, one of the two loops is selected by the switch circuit 48.

Figure 4A:
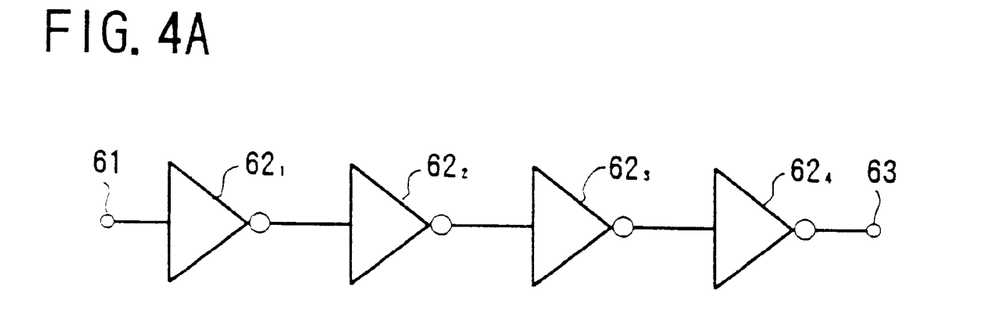
FIG. 4A is a circuit diagram of a delay circuit used in the variable frequency oscillator shown in FIG. 3.

As shown in FIG. 4A, the delay circuit 46 is made up of inverters $62_1$–$62_4$, which are cascaded. The output signal of the NAND circuit 44 is applied to a terminal 61, and an output signal obtained at a terminal 63 is applied to the switch circuit 48. The delay circuit 42 has the same configuration as shown in FIG. 4A except for the number of stages of inverters.

Figure 4B:
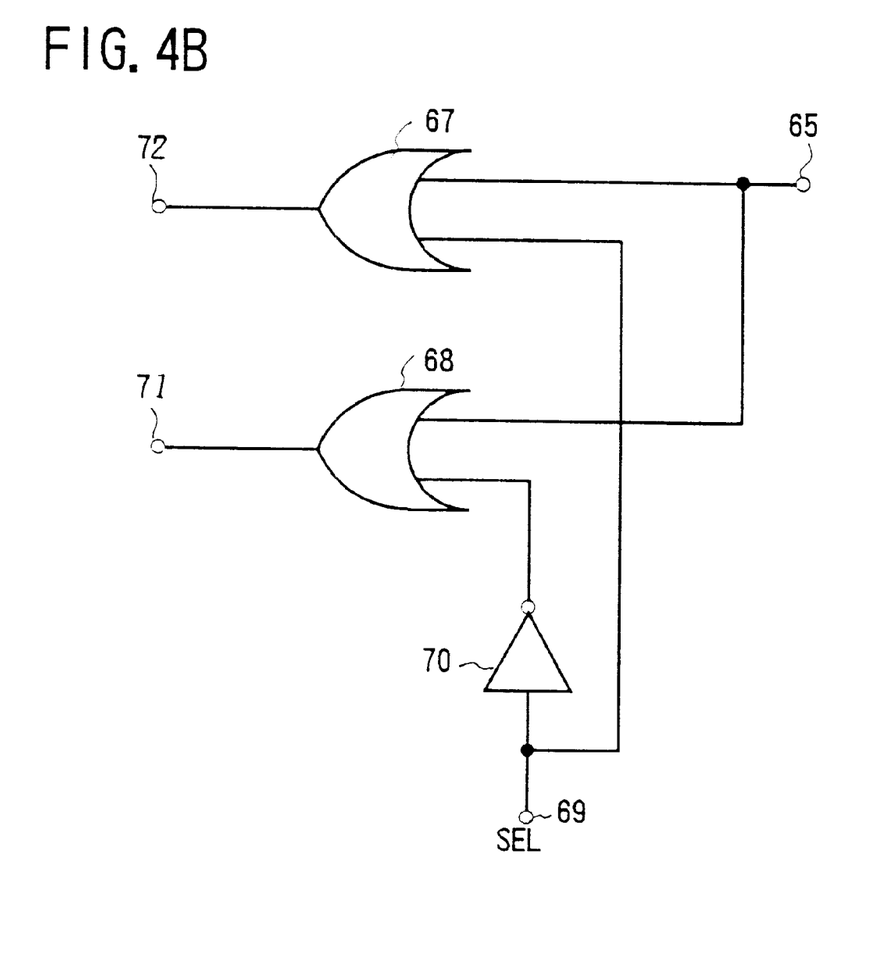
FIG. 4B is a circuit diagram of a switch circuit used in the variable frequency oscillator shown in FIG. 3.

The switch circuit 48 is configured as shown in FIG. 4B. The output signal of the delay circuit 46 is supplied to OR circuits 67 and 68 via a terminal 65. A select signal SEL supplied via a terminal 69 is supplied to the OR circuit 67, and is also inverted by an inverter 70. Then, the inverted signal is supplied to the AND circuit 68. That is, when the select signal SEL is at a high level, the signal via the terminal 65 passes through the OR circuit 68 and is supplied to the NAND circuit 44 via a terminal 71. When the select signal SEL is at a low level, the signal via the terminal 65 passes through the OR circuit 67, and is supplied to the NAND circuit 40 via a terminal 72.

An A/D (analog-to-digital) converter 52 of the input selection unit 28 converts the analog control voltage Vref, which is supplied via the terminal 30 and is indicative of the oscillation frequency, into control data of K bits, which is then applied to a selector 54. A register 56 stores digital control data, which is serially supplied via the terminal 32 and is indicative of the oscillation frequency. The digital control data is read from the register 56 and is supplied to the selector 54 in K1-bit parallel formation. The digital control data can also be read from the register 56 via a terminal 33. The selector 54 selects the control data from the A/D converter 52 or the register 56 in accordance with the select signal supplied via the terminal 34. The control data thus selected is supplied to a down counter 58 of the frequency controller 22.

The down counter 58 initiates the count operation in response to a low-level signal applied to an enable terminal EN from an inverter 57. The control data from the selector 54 is loaded to the down counter 58 at the time of the fall of a signal applied to a load terminal LD. Each time an output pulse of the NAND circuit 44 is applied, the down counter 58 counts down the count value. The K-bit count value is compared with a value of 0 (formed by K bits) by an exclusive-OR circuit 60, which outputs the select signal SEL to the switch circuit 48. The select signal SEL is at the high level when the count value is not equal to 0, and is at the low level when the count value is equal to 0. The switch circuit 48 supplies the output signal of the delay circuit 46 to the NAND circuit 44 when the select signal SEL is at the high level, so that the second loop is selected. The switch circuit 46 supplies the output of the delay circuit 46 to the NAND circuit 40 when the select signal SEL is at the low level, so that the first loop is selected.

It will now be assumed that the delay time of the first loop is the sum of the delay times of the NAND circuit 40 and the delay circuit 42 and is denoted as $T_{BASE}$ and that the delay time of the second loop made up of the NAND circuit 44, the delay circuit 46 and the switch circuit 48 is denoted as DT. It will further be assumed that the control data loaded to the down counter 58 is N. Each time the signal passes through the second loop 2N times, the first loop is selected so that the signal passes through the first loop twice. Then, the signal is output via the terminal 26 at the times of $T_{BASE}+DT\cdot 2(N-1)$ and $T_{BASE}+DT$. The cycle T of the above signal can be written as follows:

$$T = (T_{BASE} + DT) + DT \cdot 2(N-1) + (T_{BASE} + DT) \quad (1)$$
$$= 2 \cdot T_{BASE} + DT \cdot 2 \cdot N$$

The frequency F of the above signal is equal to 1/T.

Figure 5:
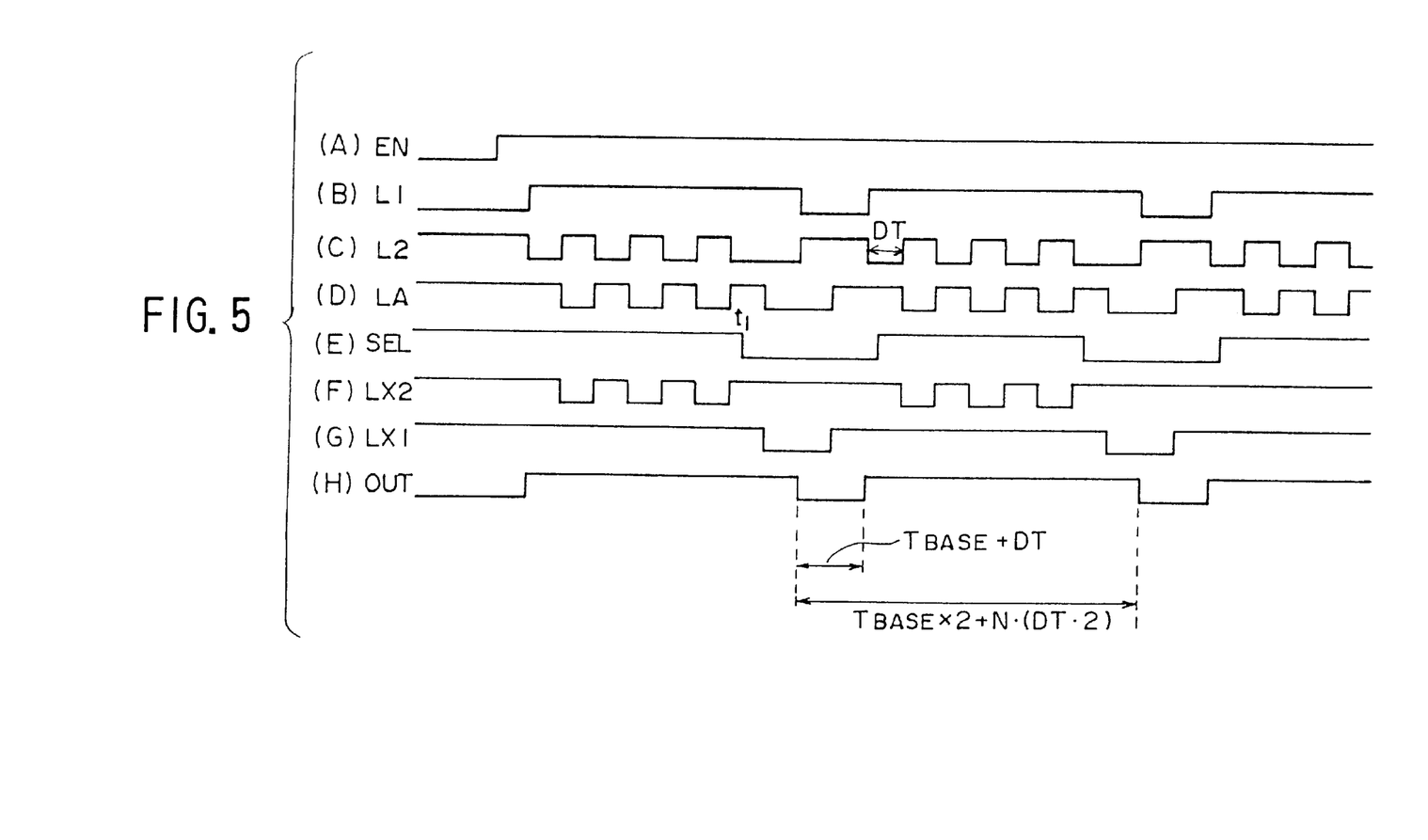
FIG. 5 is a waveform diagram of signals observed at nodes of the circuit shown in FIG. 3.

FIG. 5 is a waveform diagram of signals observed when N=4. The enable signal EN applied to the terminal 22 is switched to the high level as shown in FIG. 5(A), and the output signal L1 of the delay circuit 42 is switched to the high level, as shown in FIG. 5(B). At this time, if the down counter 58 has the loaded value N equal to 4, the select signal SEL is switched to the high level, as shown in FIG. 5(E), and the switch circuit 48 supplies the output signal LA of the delay circuit 46 shown in FIG. 5(D) to the NAND circuit 44 as a signal LX2 shown in FIG. 5(F). Hence, the second loop is selected.

In response to the output signal L2 of the NAND circuit 44, the down counter 58 performs the down-count operation. When the count value becomes 0 at time t1, the select signal SEL is switched to the low level as shown n in FIG. 5(E). The switch circuit 48 supplies a signal LX1 shown in FIG. 5(G) to the NAND circuit 40, so that the first loop is selected. Hence, the oscillation signal can be obtained at the terminal 26, as shown in FIG. 5(H).

It can be seen from formula (1) that the oscillation frequency can easily be varied merely by changing the value which is to be loaded to the down counter 58. In addition, the loaded value may be the analog voltage or the digital data. Further, the number of times that the signal circulates in the second loop can be determined by the value to be loaded to the down counter 58. Hence, the delay circuits 42 and 46 can be formed by a minimum number of inverters, so that the wide variable frequency range can be obtained by the minimum scale circuit configuration. Moreover, the present circuit is a digital circuit and does not perform the rounding of the pulse waveform carried out in the analog circuit in order to vary the delay time. Hence, the circuit is hardly affected by nose and a possibility that the jitter may occurs can be drastically suppressed. In addition, there is no need to consider a measure to reduce noise in the peripheral circuits, which can thus be down sized.

Figure 6:
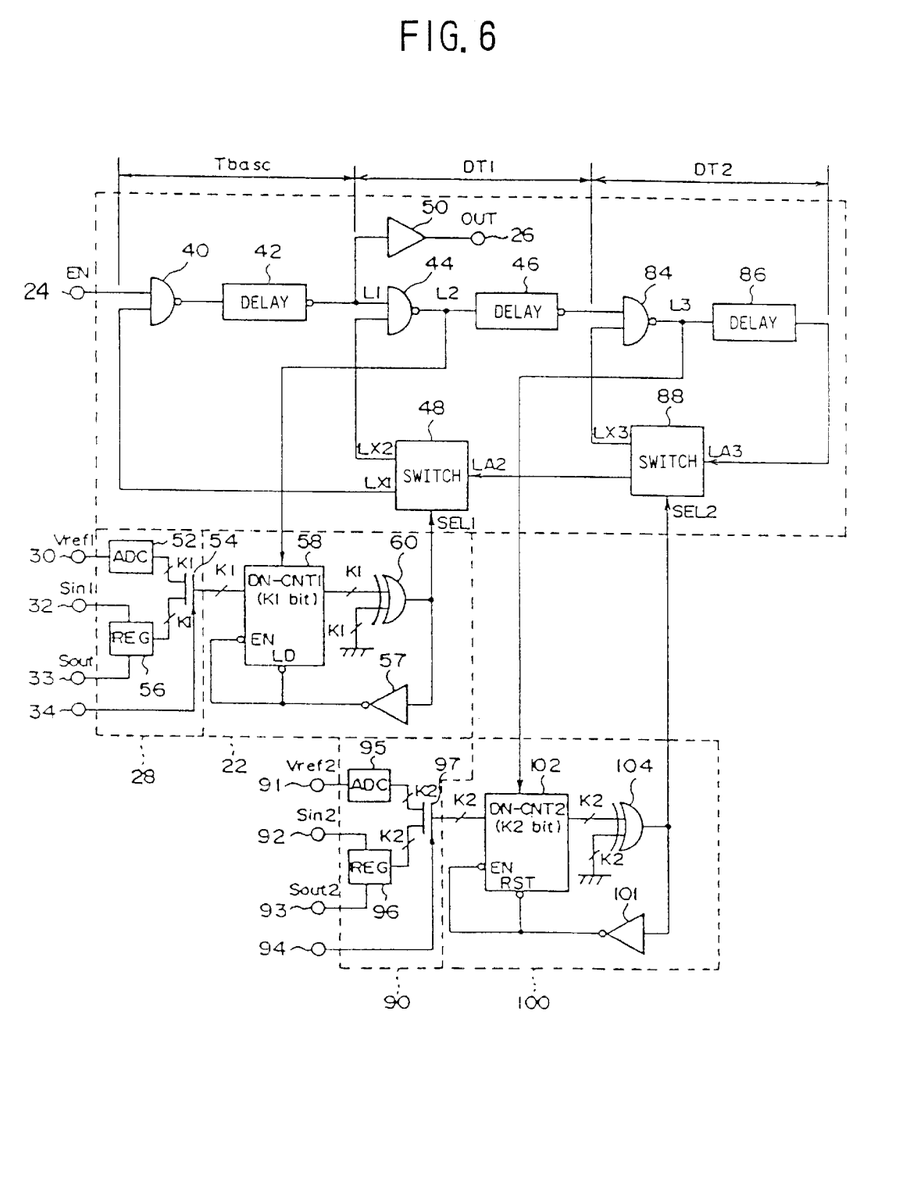
FIG. 6 is a circuit diagram of a variable frequency oscillator according to a second embodiment of the present invention.

FIG. 6 is a circuit diagram of a variable frequency oscillator according to a second embodiment of the present invention. In FIG. 6, parts that are the same as those shown in FIG. 3 are given the same reference numbers. The multiple-loop ring oscillator 20 shown in FIG. 5 is made up of NAND circuits 40, 44 and 84, delay circuits 42, 46 and 86, switch circuits 48 and 88, and the output buffer 50. The first loop is formed by the NAND circuit 40, the delay circuit 42, the NAND circuit 44, the delay circuit 46, the NAND circuit 84, the delay circuit 86, the switch circuit 88 and the switch circuit 48. The second loop is formed by the delay circuit 46, the NAND circuit 84, the delay circuit 86, the switch circuit 88 and the switch circuit 48. The third loop is formed by the NAND circuit 84, the delay circuit 86 and the switch circuit 88. That is, the switching among the first through third loops is carried out by the switch circuits 48 and 88.

The delay circuit 46 is formed by the $62_1$–$62_4$ as shown in FIG. 4A. The output signal of the NAND circuit 44 is supplied to the terminal 61, and the output signal obtained at the terminal 63 is supplied to the switch circuit 48. The delay circuits 42 and 86 have the same configuration except for the number of stages of inverters.

Each of the switch circuits 48 and 88 is configured as shown in FIG. 4B. The output signal of the delay circuit 46 or 86 is supplied to the OR circuit 67 or 68 via the terminal 65. Select signal SEL1 or SEL2 supplied via the terminal 69 is supplied to the OR circuit 67, and is inverted by the inverter 70, whereby the inverted signal is supplied to the OR circuit 68. That is, when the select signal SEL1 or SEL2 is at the high level, the signal from the terminal 65 passes through the OR circuit 68, and is supplied to the NAND circuit 44 or 94 via the terminal 71. When the select signal SEL1 or SEL2 is at the low level, the signal from the terminal 65 passes through the OR circuit 67 and is supplied to the NAND circuit 40 or the switch circuit 48 via the terminal 72.

The A/D converter 52 of the first input selection unit 28 converts the analog control voltage Vref1, which is supplied via the terminal 30 and is indicative of the oscillation frequency, into control data of K1 bits, which is then supplied to the selector 54. The register 56 stores digital control data, which is serially supplied via the terminal 32 and is indicative of the oscillation frequency. The digital control data is read from the register 56 and is supplied to the selector 54 in K1-bit parallel formation. The digital control data can also be read from the register 56 via the terminal 33. The selector 54 selects the control data from the A/D converter 52 or the register 56 in accordance with the select signal supplied via the terminal 34. The control data thus selected is supplied to the down counter 58 of the frequency controller 22.

The down counter 58 initiates the count operation in response to the low-level signal applied to the enable terminal EN from the inverter 57. The control data from the selector 54 is loaded to the down counter 58 at the time of the fall of the signal applied to the load terminal LD. Each time the output pulse of the NAND circuit 44 is applied, the down counter 58 counts down the count value. The K1-bit count value is compared with a value of 0 (formed by K1 bits) by the exclusive-OR circuit 60, which outputs the select signal SEL1 to the switch circuit 48. The select signal SEL1 is at the high level when the count value is not equal to 0, and is at the low level when the count value is equal to 0. The switch circuit 48 supplies the output signal of the delay circuit 46 to the NAND circuit 44 when the select signal SEL1 is at the high level, so that the second loop is selected. The switch circuit 46 supplies the output of the delay circuit 46 to the NAND circuit 40 when the select signal SEL1 is at the low level, so that the first loop is selected.

An A/D converter 95 of a second selection unit 90 converts an analog control voltage Vref2, which is supplied via a terminal 91 and is indicative of an analog control voltage, into control data of K2 bits, which is then supplied to a selector 97. A register 96 stores digital control data, which is serially supplied via the terminal 92 and is indicative of the oscillation frequency. The digital control data is read from the register 96 and is supplied to the selector 97 in K2-bit parallel formation. The digital control data can also be read from the register 96 via a terminal 93. The selector 97 selects the control data from the A/D converter 95 or the register 96 in accordance with the select signal supplied via the terminal 94. The control data thus selected is supplied to a down counter 102 of a frequency controller 100.

The down counter 102 initiates the count operation in response to the low-level signal applied to an enable terminal EN from an inverter 101. The control data from the selector 97 is loaded to the down counter 102 at the time of the fall of the signal applied to the load terminal LD. Each time the output pulse of the NAND circuit 84 is applied, the down counter 102 counts down the count value. The K2-bit count value is compared with a value of 0 (formed by K2 bits) by am exclusive-OR circuit 104, which outputs the select signal SEL2 to the switch circuit 88. The select signal SEL2 is at the high level when the count value is not equal to 0, and is at the low level when the count value is equal to 0. The switch circuit 88 supplies the output signal of the delay circuit 86 to the NAND circuit 84 when the select signal SEL2 is at the high level, so that the third loop is selected. The switch circuit 88 supplies the output of the delay circuit 86 to the switch circuit 48 when the select signal SEL2 is at the low level, so that the first or second loop is selected.

It will now be assumed that the delay time of the first loop is the sum of the delay times of the NAND circuit 40 and the delay circuit 42 and is denoted as $T_{BASE}$ and that the delay time of the second loop (the NAND circuits 44 and 84, the delay circuits 46 and 86 and the switch circuits 48 and 88 is denoted as DT1, and the delay time of the third loop (the NAND circuit 84, the delay circuit 86 and the switch circuit 88) is denoted as DT2. It will further be assumed that the control data loaded to the down counter 58 is N and the control data to be loaded to the down counter 88 is M. The cycle T of the signal output via the terminal 26 can be written as follows:

$$T = 2 \cdot T_{BASE} + N \cdot (DT1 \cdot 2 + M \cdot (DT2 \cdot 2)) \qquad (2)$$

The frequency F of the above signal is equal to 1/T.

Figure 7:
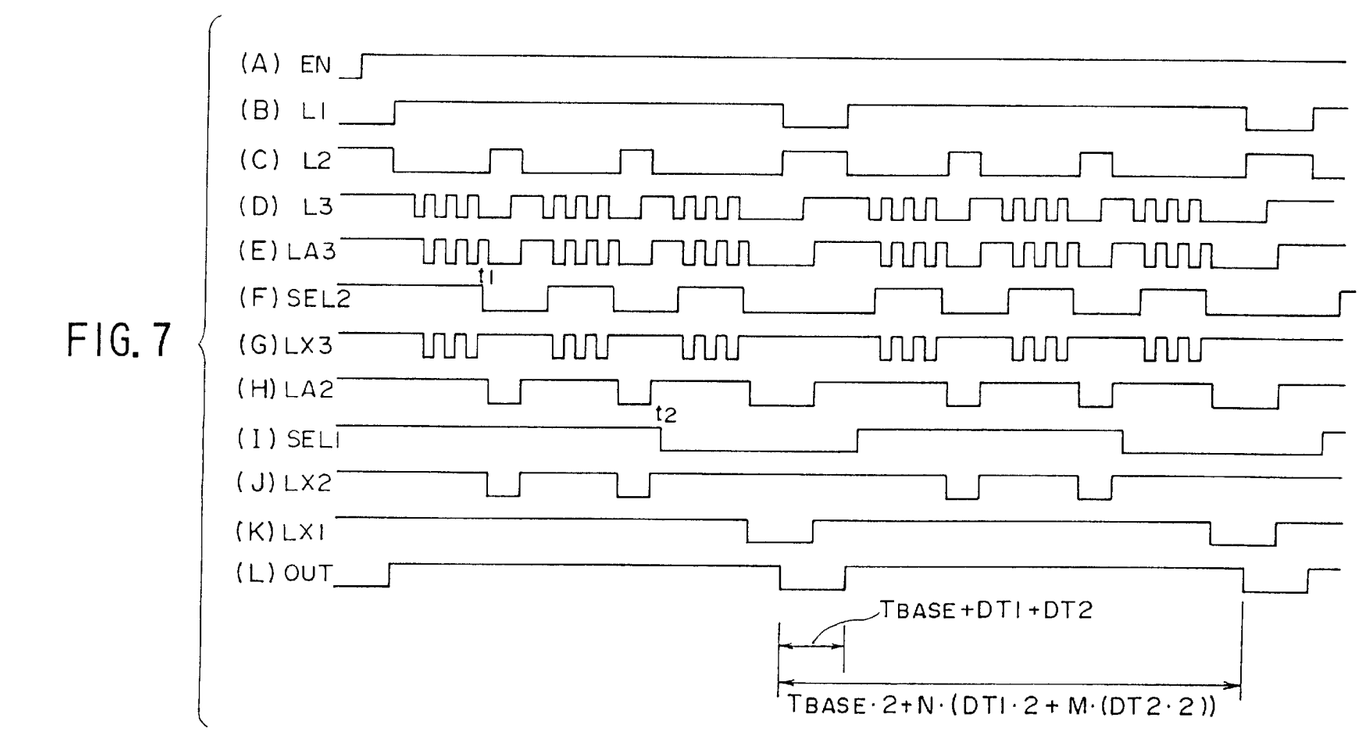
FIG. 7 is a waveform diagram of signals observed at nodes of the circuit shown in FIG. 6.

FIG. 7 is a waveform diagram of signals observed when N=3 and M=4. The enable signal EN applied to the terminal 22 is switched to the high level, as shown in FIG. 7(A) and the output signal L1 of the delay circuit 42 is switched to the high level, as shown in FIG. 7(B). In this case, if the down counters 58 and 102 have the respective loaded values N and M equal to 3 and 4, respectively, the select signals SEL2 and SEL1 are at the high level, as shown in FIGS. 7(F) and 7(I). The switch circuit 88 supplies the output signal LA3 of the delay circuit 86 shown in FIG. 7(E) to the NAND circuit 84 as a signal LX3, so that the third loop is selected.

In response to the output signal L3 of the NAND circuit shown in FIG. 7(D), the down counter 102 performs the down count operation. When the count value becomes equal to 0 at time t1, the select signal SEL2 is switched to the low level, as shown in FIG. 7(F), and thus the switch circuit 88 supplies the switch circuit 48 with a signal LA2 shown in FIG. 7(H). At this time, the select signal SEL1 shown in FIG. 7(I) is at the high level. Thus, the switch circuit 48 supplies the signal LA2 to the NAND circuit 44 as a signal LX2, so that the second loop is selected.

Then, the down counter 58 performs the down count operation in response to the output signal L2 of the NAND circuit 44 shown in FIG. 7(C). When the count value becomes equal to 0 at time t2, the select signal SEL1 is switched to the low level as shown in FIG. 7(I), so that the switch circuit 48 supplies the signal LX1 shown in FIG. 7(K) to the NAND circuit 40 and the first loop is selected. Hence, the oscillation signal shown in FIG. 7(H) is output via the terminal 26.

It can be seen from formula (2) that the oscillation frequency can easily be varied merely by changing the values which are to be loaded to the down counters 58 and 102. In addition, the loaded values may be the analog voltages or the digital data. Further, the number of times that the signal circulates in the second and third loops can be determined by the values to be loaded to the down counter 58. Hence, the delay circuits 42, 46 and 86 can be formed by a minimum number of inverters, so that the wide variable frequency range can be obtained by the minimum scale circuit configuration. Further, the present oscillator has the second and third loops, so that it has a reduced frequency adjustment width and is capable of oscillating frequencies within the increased range from a comparatively low oscillation frequency to a comparatively high oscillation frequency.

Moreover, the present circuit is a digital circuit and does not perform the rounding of the pulse waveform carried out in the analog circuit in order to vary the delay time. Hence, the circuit is hardly affected by nose and a possibility that the jitter may occurs can be drastically suppressed. In addition, there is no need to consider a measure to reduce noise in the peripheral circuits, which can thus be down sized.

The configurations shown in FIGS. 3 and 6 may be modified so that the delay circuit 42 is omitted and a signal obtained by an AND operation on the signal LX1 and the enable signal EN is input to the NAND circuit 44 and the output buffer 50. In this case, the periods of the high-level and low-level can be obtained by setting the cycle $T_{BASE}$ equal to 0 ($T_{BASE}$=0).

The present invention is not limited to the specifically disclosed embodiments, and variations and modifications may be made without departing from the scope of the present invention.

What is claimed is:

1. A variable frequency oscillator comprising:
    an oscillator unit including a ring oscillator having multiple loops; and
    a frequency control unit controlling switching among the multiple loops in accordance with a switch controlling input signal for determining an oscillator frequency and thus generating an oscillation signal having the oscillation frequency.

2. The variable frequency oscillator as claimed in claim 1, wherein the oscillation unit comprises:
    a first loop;
    a second loop having a part of the first loop; and
    a switch circuit controlling switching between the first and second loops.

3. The variable frequency oscillator as claimed in claim 2, wherein said frequency control unit comprises:
    a counter counting the number of times that a signal circulates in the second loop in accordance with the value of the control input; and
    a logic circuit generating a select signal indicating the switching between the first loop and the second loop on the basis of a count value of the counter, the select signal being supplied to the switch circuit.

4. The variable frequency oscillator as claimed in claim 1, wherein the oscillation unit comprises:
    a first loop;
    a second loop having a part of the first loop;
    a third loop having a part of the second loop;
    a first switch circuit controlling switching between the first and second loops; and
    a second switch circuit controlling switching between the second and third loops.

5. The variable frequency oscillator as claimed in claim 1, wherein:
    the control input is an analog voltage; and
    the variable frequency oscillator comprises an analog-to-digital converter converting the analog voltage into digital data, which is supplied to the frequency control unit.

6. The variable frequency oscillator as claimed in claim 1, wherein:
    the control input is digital data; and
    the variable frequency oscillator comprises a register which stores the digital data, which is then supplied to the frequency control unit.

7. The variable frequency oscillator as claimed in claim 1, wherein:
    the control input is one of an analog voltage and digital data; and
    wherein the variable frequency oscillator comprises:
        an analog-to-digital converter converting the analog voltage into a digital signal;
        a register which stores the digital data; and
        a selector selectively outputting one of the digital signal and the digital data to the frequency control unit.

8. A variable frequency oscillator comprising:
    an oscillation unit including a ring oscillator having multiple loops; and
    a frequency control unit controlling, switching among the multiple loops in accordance with a switch controlling input signal for determining an oscillation frequency and thus generating an oscillation signal having the oscillation frequency,
    wherein the oscillation unit comprises:
        a first loop;
        a second loop having a part of the first loop;
        a third loop having a part of the second loop;
        a first switch circuit controlling switching between the first and second loops; and a second switch circuit controlling switching between the second and third loops, wherein said frequency control unit comprises:

a first counter counting the number of times that a signal circulates in the second loop in accordance with the value of the control input;

a second counter counting the number of times that a signal circulates in the third loop in accordance with the value of the control input;

a first logic circuit generating a select signal indicating the switching between the first loop and the second loop on the basis of a count value of the first counter, the select signal being supplied to the switch circuit; and a second logic circuit generating another select signal indicating the switching between the second loop and the third loop on the basis of a count value of the second counter, said another select signal being supplied to the switch circuit.

9. A variable frequency oscillator comprising:

a oscillator generating a first pulse signal and a second pulse signal;

an output unit which outputs said first pulse signal;

an counter counting the number of times that said second pulse signal is circularly propagated through the ring oscillator; and a control circuit supplying said first pulse signal to the output unit when the counter counts a given count value.

* * * * *